(12) United States Patent
Kobayashi

(10) Patent No.: US 8,975,538 B2
(45) Date of Patent: Mar. 10, 2015

(54) WALL-MOUNTED HOUSING APPARATUS HAVING SIMPLE STRUCTURE AND SHALLOW DEPTH DIMENSION, AND ELECTRONIC APPARATUS

(71) Applicant: Masaki Kobayashi, Kanagawa (JP)

(72) Inventor: Masaki Kobayashi, Kanagawa (JP)

(73) Assignee: NEC Infrontia Corporation, Kanagawa (JP)

( * ) Notice: Subject to any disclaimer, the term of this patent is extended or adjusted under 35 U.S.C. 154(b) by 0 days.

(21) Appl. No.: 14/364,474

(22) PCT Filed: Nov. 8, 2012

(86) PCT No.: PCT/JP2012/079582
§ 371 (c)(1),
(2) Date: Jun. 11, 2014

(87) PCT Pub. No.: WO2013/094348
PCT Pub. Date: Jun. 27, 2013

(65) Prior Publication Data
US 2014/0347790 A1    Nov. 27, 2014

(30) Foreign Application Priority Data
Dec. 19, 2011    (JP) ................................. 2011-276713

(51) Int. Cl.
*H02B 1/40* (2006.01)
*H01R 13/502* (2006.01)
*H05K 5/03* (2006.01)

(52) U.S. Cl.
CPC ....................................... *H05K 5/03* (2013.01)
USPC ......................................... 174/480; 174/559

(58) Field of Classification Search
USPC ........ 174/480, 559; 16/374, 82, 83, 230, 231, 16/232, 310, 289, 309, 313; 292/269, 277
See application file for complete search history.

(56) References Cited

U.S. PATENT DOCUMENTS

| | | | | |
|---|---|---|---|---|
| 3,975,857 A | * | 8/1976 | Branson et al. | 43/61 |
| 4,290,549 A | * | 9/1981 | Getz, Jr. | 232/35 |
| 5,228,584 A | * | 7/1993 | Williams, Jr. | 220/3.8 |
| 5,645,333 A | * | 7/1997 | Sakurai | 312/322 |

(Continued)

FOREIGN PATENT DOCUMENTS

| CN | 2754184 Y | 1/2006 |
|---|---|---|
| CN | 201479481 U | 5/2010 |

(Continued)

OTHER PUBLICATIONS

International Search Report for PCT/JP2012/079582 dated Feb. 19, 2013.

(Continued)

*Primary Examiner* — Adrian S Wilson
*Assistant Examiner* — Abhishek Rathod
(74) *Attorney, Agent, or Firm* — Sughrue Mion, PLLC

(57) ABSTRACT

A wall-mounted housing apparatus includes: a rear case (10); a front cover (20); and a retaining mechanism including a fixed engagement portion (41) and a movable engagement portion (46). The movable engagement portion (46) includes a slidable slide bar (462). The slide bar (462) includes a bar main body (462a) slidable in an apparatus height direction (H), which is the direction when the front cover (20) is closed, and a portion (462b) to be supported. When the front cover (20) is opened upward at an angle larger than 90°, the slide bar (462) slides down due to its weight, and then, when the front cover (20) is closed at 90°, the portion (462b) to be supported is supported by a support surface (412b) of the fixed engagement portion (41). In such a way, the front cover (20) is retained in a state of being opened at 90°.

6 Claims, 4 Drawing Sheets

(56) References Cited

U.S. PATENT DOCUMENTS

| | | | |
|---|---|---|---|
| 5,697,655 A * | 12/1997 | Strong | 292/230 |
| 5,758,937 A * | 6/1998 | Lammens et al. | 312/328 |
| 5,904,411 A * | 5/1999 | Hayakawa | 312/319.2 |
| 5,910,642 A * | 6/1999 | Daoud | 174/57 |
| 6,028,267 A * | 2/2000 | Byrne | 174/59 |
| 6,730,845 B1 * | 5/2004 | Criniti et al. | 174/67 |
| 6,779,856 B2 * | 8/2004 | Hornberger et al. | 312/295 |
| 7,151,221 B1 * | 12/2006 | Backofen et al. | 174/67 |
| 7,485,804 B2 * | 2/2009 | Dinh et al. | 174/50 |
| RE41,661 E * | 9/2010 | Dinh | 174/50 |
| 7,968,794 B1 * | 6/2011 | Baldwin | 174/67 |
| 2002/0113532 A1 * | 8/2002 | Hornberger et al. | 312/323 |
| 2008/0277134 A1 * | 11/2008 | Jolly | 174/67 |

FOREIGN PATENT DOCUMENTS

| | | | |
|---|---|---|---|
| JP | 56-111041 U | 8/1981 | |
| JP | 59-50475 U | 4/1984 | |
| JP | 61-82488 U | 5/1986 | |
| JP | 7-20676 U | 4/1995 | |
| JP | 8-177291 A | 7/1996 | |
| JP | 2000-320219 A | 11/2000 | |
| JP | 2003-97130 A | 4/2003 | |
| JP | 2004-363361 A | 12/2004 | |
| JP | 2005-314974 A | 11/2005 | |
| JP | 2006-222269 A | 8/2006 | |
| JP | 2010-129846 A | 6/2010 | |

OTHER PUBLICATIONS

Japanese Office Action for JP 2011-276713 dated Feb. 13, 2013.
Communication dated Dec. 25, 2014, issued by the State Intellectual Property Office of P.R. China in counterpart Chinese application No. 201280061283.X.

* cited by examiner

WALL-MOUNTED HOUSING APPARATUS HAVING SIMPLE STRUCTURE AND SHALLOW DEPTH DIMENSION, AND ELECTRONIC APPARATUS

CROSS REFERENCE TO RELATED APPLICATIONS

This application is a National Stage of International Application No. PCT/JP2012/079582 filed Nov. 8, 2012, claiming priority based on Japanese Patent Application No. 2011-276713 filed Dec. 19, 2011, the contents of all of which are incorporated herein by reference in their entirety.

TECHNICAL FIELD

This invention relates to a wall-mounted housing apparatus to be applied to an electronic apparatus and installed on a wall surface, for housing a component of the electronic apparatus.

BACKGROUND ART

As this type of housing apparatus, the following housing apparatus is known. When an object to be housed is, for example, a component of a central unit of a home security system, in order that a service engineer may operate an operation button or dial of the central unit, connect a maintenance apparatus or the like to an input and output connector, or remove and replace the component of the central unit when the service engineer performs initial setting, maintenance, repair and replacement, or the like, a cover is mounted to a main body (case) of the housing apparatus so that an opening portion for access to the inside of the case is normally closed and is opened when needed.

In particular, when the housing apparatus is a wall-mounted housing apparatus to be installed on a wall surface, in many cases, the housing apparatus is installed on a part of the wall surface close to a ceiling, that is, on an upper side of the wall surface. Therefore, in order not to hinder work of the service engineer or a user of an electronic apparatus from below the electronic apparatus (housing apparatus), and not to occupy the right and left areas of the wall surface to which the housing apparatus is installed, in general, a front cover is mounted to an upper edge of a front side opening portion of a rear case, which houses the component of the electronic apparatus and is installed on the wall surface, through intermediation of a hinge mechanism, and the front cover is opened so as to pivot upward when needed.

In the wall-mounted housing apparatus, when the service engineer or the user of the electronic apparatus performs work on the component of the electronic apparatus that is housed in the rear case, it is preferred that the front cover be maintained in a state of being opened upward at 90° (normally, a state of being opened horizontally) so as not to hinder the work. However, unless the opened front cover is supported by the user or the like, the front cover closes due to its weight. Therefore, for this type of wall-mounted housing apparatus, it is essential to provide a mechanism for retaining the front cover in a state of being opened horizontally.

For example, Patent Literatures 1 to 4 disclose housing apparatus of the type including, at an opening portion of a case that houses an object to be housed, a cover openable and closable through intermediation of a hinge mechanism, and a mechanism for retaining the cover in a state of being opened.

The housing apparatus disclosed in Patent Literature 1 is a mailbox that does not house the component of the electronic apparatus but temporarily houses mail, newspaper, or the like. Further, the housing apparatus disclosed in Patent Literature 1 is not the wall-mounted housing apparatus, but is installed on the ground through intermediation of a pole or embedded in a wall of a house. A cover (rear cover) is mounted to an upper edge of an opening portion (port for picking up mail) of a case (main body), which temporarily houses mail or the like, through intermediation of a hinge mechanism so as to be openable and closable. The rear cover includes an elongated hole portion as the hinge mechanism. On the other hand, a stopper bracket is provided to an upper side inside the main body. The rear cover is opened horizontally, and then pushed into a depth side of the main body. Thus, a distal end of the rear cover engages with the stopper bracket provided to the upper side inside the main body. With this structure, the rear cover is retained in a state of being opened in the horizontal direction. The housing apparatus disclosed in Patent Literature 2 is applied to a vending machine, and is not the wall-mounted housing apparatus, but is a relatively large housing apparatus to be installed on the floor surface or the ground. A cover (loading door) is mounted to an upper edge of a front side opening portion of a case (main body) through intermediation of a hinge mechanism so as to be openable and closable. Gas springs are provided between the main body and the loading door. The loading door is retained in a state of being opened in the horizontal direction due to urging force of the gas springs.

The housing apparatus disclosed in Patent Literature 3 is a cargo transporter of a motor van that does not house the component of the electronic apparatus but houses luggage. Further, the housing apparatus disclosed in Patent Literature 3 is not the wall-mounted housing apparatus, but is integrally mounted to a chassis. Further, a cover (door) is mounted to a side edge of an opening portion of a case (cargo transporter) through intermediation of a hinge mechanism. Hinged double doors are mounted to an end portion of a side wall of the cargo transporter through intermediation of the hinge mechanism so as to be openable and closable. A slide holder having an L-shaped elongated hole formed at an end portion thereof is mounted to an inner side of the door. On the other hand, an arm is mounted to the end portion of an inner side of the side wall of the cargo transporter through intermediation of a two-axis hinge mechanism so as to be pivotable about each of two axes of the hinge mechanism. A flanged pin that slides in the elongated hole of the slide holder is provided to a distal end of the arm. The door in a state of being opened sideways at 90° is retained in such a manner that the flanged pin provided to the distal end of the arm engages with an end portion of the L-shaped elongated hole of the slide holder due to a weight of the arm.

The housing apparatus disclosed in Patent Literature 4 is not the wall-mounted housing apparatus, but is installed on the desk or the floor. A cover (door) is mounted to a side edge of an opening portion of a case (housing of an apparatus) through intermediation of a hinge mechanism. The door is mounted to an end portion of a side wall of the housing of the apparatus through intermediation of the hinge mechanism so as to be openable and closable. An L-shaped engagement member is axially supported at a lower edge of the opening portion of the housing of the apparatus so as to be pivotable. On the other hand, an engagement tool is mounted to a lower edge portion of an inner side of the door. The engagement tool has an elongated hole and a plurality of hole portions formed in parallel along the elongated hole. A distal end of the engagement member is loosely fitted into the elongated hole of the engagement tool in a slidable manner. The door in a state of being opened sideways at 90° is retained by the distal end of the engagement member that engages with one of the plurality of hole portions of the engagement tool.

CITATION LIST

Patent Literature

Patent Literature 1: Japanese Unexamined Utility Model Application Publication (JP-A) No. S61-082488
Patent Literature 2: Japanese Unexamined Utility Model Application Publication (JP-A) No. H 07-020676
Patent Literature 3: Japanese Unexamined Patent Application Publication (JP-A) No. 2003-097130
Patent Literature 4: Japanese Unexamined Patent Application Publication (JP-A) No. 2005-314974

DISCLOSURE OF THE INVENTION

Problem to be Solved by the Invention

However, the mechanisms for retaining the cover as disclosed in Patent Literatures 3 and 4 are used for a housing apparatus whose cover opens sideways with respect to an opening portion of a case, and the mechanisms cannot be applied to a wall-mounted housing apparatus whose cover opens upward with respect to an opening portion of a case.

Further, the mechanism for retaining the cover as disclosed in Patent Literature 2 is used for a relatively large housing apparatus, and hence the mechanism has a complex structure including the gas springs.

Further, the mechanism for retaining the cover as disclosed in Patent Literature 1 is used for a housing apparatus that is not a wall-mounted type, for example, a housing apparatus to be embedded in the wall of the house. Due to a sufficient depth dimension of the case, the cover in a state of being opened horizontally is pushed into the depth side of the case. Accordingly, the size of the case in the depth direction is relatively large. Therefore, the mechanism for retaining the cover as disclosed in Patent Literature 1 is not suitable for a wall-mounted housing apparatus including a so-called thin case having a relatively shallow depth dimension. Further, the mechanism for retaining the cover as disclosed in Patent Literature 1 has a complex structure in order to enable a liner operation in the depth direction as well as a pivoting operation of the hinge mechanism.

In view of the above-mentioned circumstances, it is an object of this invention to provide a wall-mounted housing apparatus having a simple structure and a shallow depth dimension.

Means to Solve the Problem

According to one embodiment of this invention, there is provided a wall-mounted housing apparatus, which is configured to house a component of an electronic apparatus and is to be installed on a wall surface, the wall-mounted housing apparatus installed on the wall surface having defined therein an apparatus width direction and an apparatus height direction that are parallel to the wall surface, and an apparatus depth direction that is perpendicular to the wall surface, the wall-mounted housing apparatus including: a rear case having a front side opening portion and having a semi-container shape, the rear case being configured to house the component of the electronic apparatus, the rear case having a back surface that is mounted to the wall surface; a front cover having a plate shape, the front cover being mounted to an upper side of the front side opening portion of the rear case through intermediation of a hinge mechanism so as to be openable and closable upward at an angle larger than 90°; and a retaining mechanism interposed between the rear case and the front cover, for retaining the front cover in a state of being opened at 90°, the retaining mechanism including: a fixed engagement portion provided to the upper side of the front side opening portion of the rear case; and a movable engagement portion provided to the front cover, for retaining the front cover in the state of being opened at 90° in such a manner that the movable engagement portion in a state in which the front cover is opened at 90° disengageably engages with the fixed engagement portion, the fixed engagement portion having a support surface facing upward, the movable engagement portion including a slide bar provided to a back surface of the front cover at a position corresponding to the fixed engagement portion so as to be slidable in the apparatus height direction, which is the direction when the front cover is closed, the slide bar including: a bar main body slidable in the apparatus height direction, which is the direction when the front cover is closed; and a portion to be supported, which is projected downward in the apparatus height direction from an end portion of the bar main body, which is located on a depth side in the apparatus depth direction when the front cover is opened upward at 90°, the front cover being retained in the state of being opened at 90° in such a manner that, when the front cover is opened upward at the angle larger than 90°, the slide bar slides toward the depth side in the apparatus depth direction due to its weight, and then, when the front cover is closed at 90°, the portion to be supported is supported by the support surface of the fixed engagement portion.

Further, according to one embodiment of this invention, there is provided an electronic apparatus, including: the above-mentioned wall-mounted housing apparatus; and the component housed in the wall-mounted housing apparatus.

EFFECT OF THE INVENTION

The wall-mounted housing apparatus according to one embodiment of this invention has a simple structure and a shallow depth dimension.

BEST MODE FOR EMBODYING THE INVENTION

Figure 1:
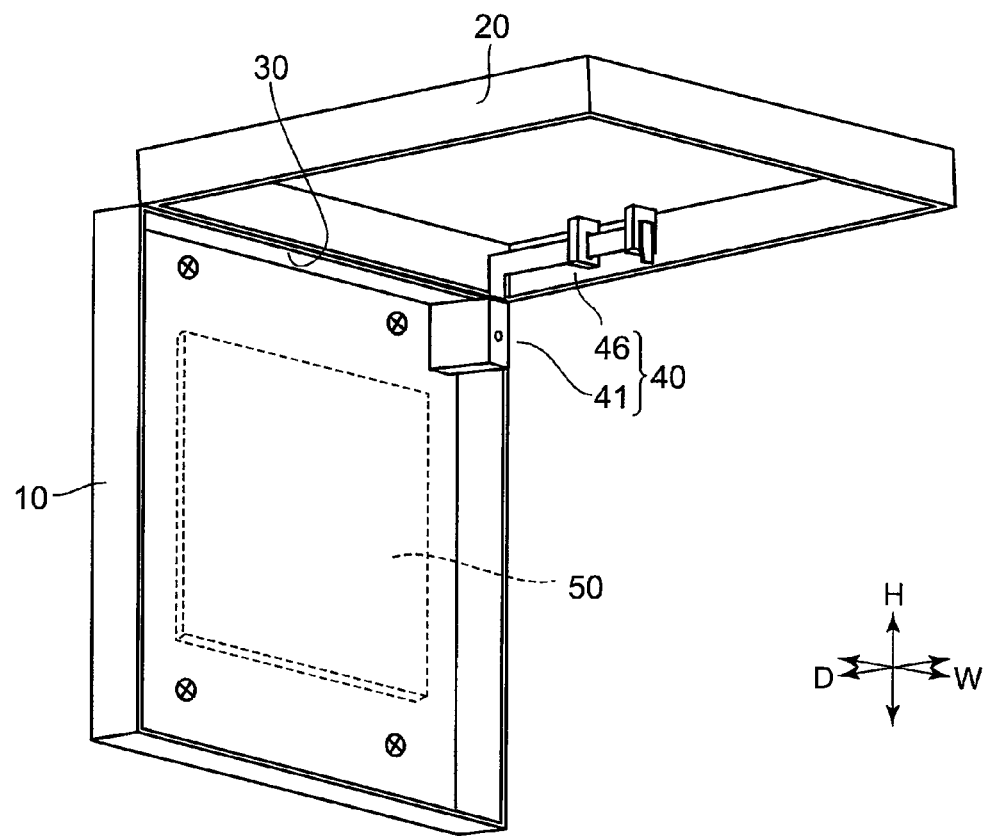
FIG. 1 is a perspective view illustrating a wall-mounted housing apparatus according to an embodiment of this invention.

A wall-mounted housing apparatus according to this invention is configured to house a component of an electronic apparatus and is to be installed on a wall surface. The wall-mounted housing apparatus installed on the wall surface has defined therein an apparatus width direction and an apparatus height direction that are parallel to the wall surface, and an apparatus depth direction that is perpendicular to the wall surface.

The wall-mounted housing apparatus of this invention includes a rear case, a front cover, and a retaining mechanism. The rear case has a front side opening portion and has a semi-container shape. The rear case houses the component of the electronic apparatus, and a back surface thereof is mounted to the wall surface. On the other hand, the front cover has a plate shape, and is mounted to an upper side of the front side opening portion of the rear case through intermediation of a hinge mechanism so as to be openable and closable upward at an angle larger than 90°.

The retaining mechanism is interposed between the rear case and the front cover, and retains the front cover in a state of being opened at 90°. Further, the retaining mechanism includes a fixed engagement portion and a movable engagement portion. The fixed engagement portion is provided to the upper side of the front side opening portion of the rear case. On the other hand, the movable engagement portion is provided to the front cover. The front cover is retained in the state of being opened at 90° in such a manner that the movable engagement portion in a state in which the front cover is opened at 90° disengageably engages with the fixed engagement portion. Further, the fixed engagement portion has a support surface facing upward. On the other hand, the movable engagement portion includes a slide bar provided on a back surface of the front cover at a position corresponding to the fixed engagement portion so as to be slidable in the apparatus height direction, which is the direction when the front cover is closed.

The slide bar includes: a bar main body slidable in the apparatus height direction, which is the direction when the front cover is closed; and a portion to be supported, which is projected downward in the apparatus height direction from an end portion of the bar main body, which is located on a depth side in the apparatus depth direction when the front cover is opened upward at 90°. The front cover is retained in the state of being opened at 90° in such a manner that, when the front cover is opened upward at the angle larger than 90°, the slide bar slides toward the depth side in the apparatus depth direction due to its weight, and then, when the front cover is closed at 90°, the portion to be supported is supported by the support surface of the fixed engagement portion.

Thus, the wall-mounted housing apparatus according to this invention has a simple structure and a shallow depth dimension.

Now, a wall-mounted housing apparatus according to a specific embodiment of this invention is described with reference to the drawings.

Embodiment

Figure 2:
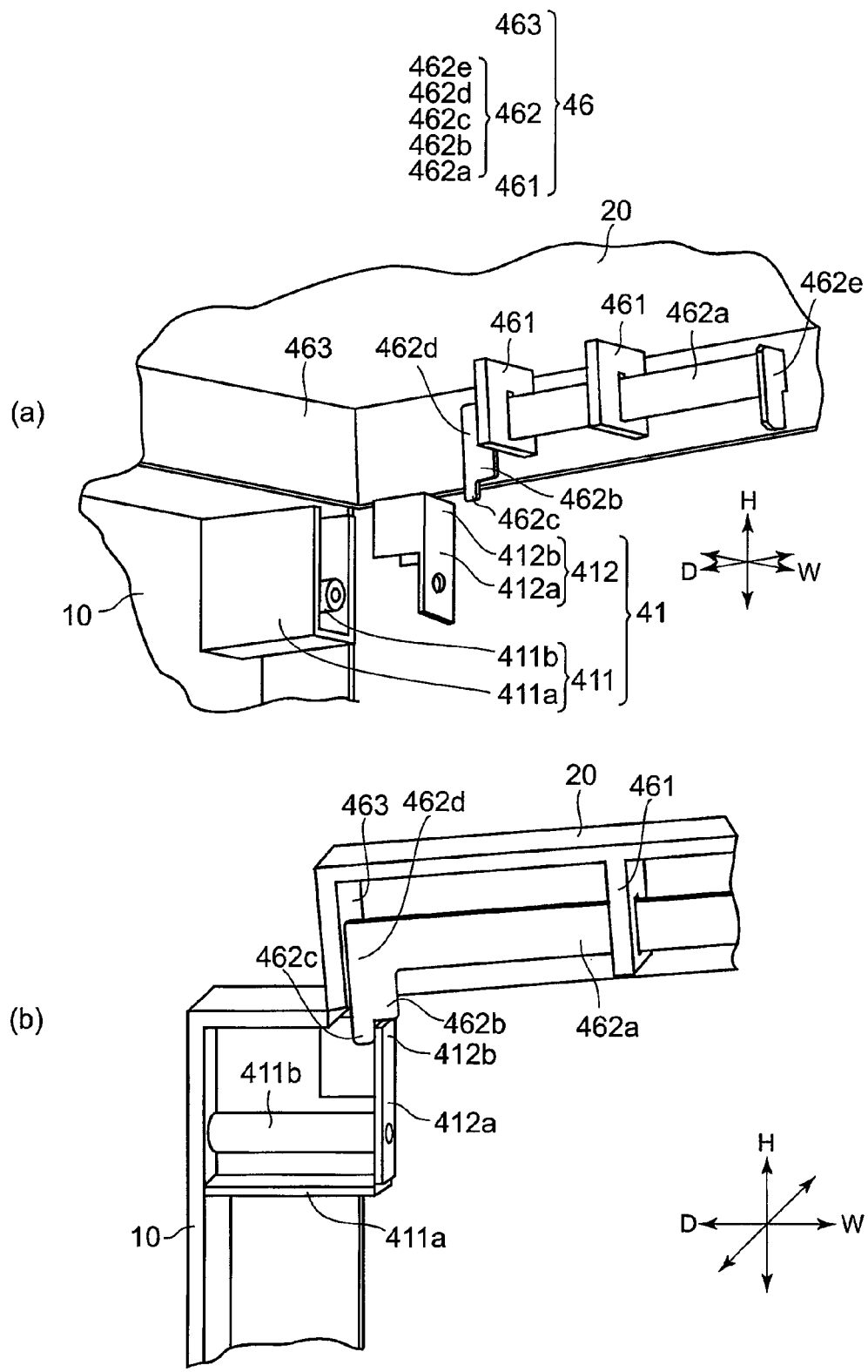
FIG. 2 includes (a) and (b) which are perspective views partially illustrating a main part of the wall-mounted housing apparatus according to the embodiment of this invention.

Referring to FIGS. 1, 2(a), and 2(b), the wall-mounted housing apparatus according to the embodiment of this invention houses, for example, a control circuit board 50 as a component of a central unit of a home security system, and is installed on a wall surface inside a house to which the home security system is installed. The wall-mounted housing apparatus of this embodiment installed on the wall surface has defined therein an apparatus width direction W and an apparatus height direction H that are parallel to the wall surface, and an apparatus depth direction D that is perpendicular to the wall surface.

The wall-mounted housing apparatus of this embodiment includes a rear case 10, a front cover 20, a hinge mechanism 30, and a retaining mechanism 40. In this embodiment, the rear case 10, the front cover 20, and the retaining mechanism 40 are made of a resin. Note that, in this invention, any one of the rear case 10, the front cover 20, and the retaining mechanism 40 may be made of a metal, or may be made of the combination of a resin component and a metal component.

The rear case 10 has a front side opening portion and has a semi-container shape. The rear case 10 houses the circuit board 50 as a component of an electronic apparatus, and a back surface thereof is mounted to the wall surface. As illustrated in FIG. 1, for example, the rear case 10 is mounted to the wall surface with four screws. Further, although not illustrated, the rear case 10 has a cutout portion and a hole portion formed in the back surface thereof or upper, lower, right, and left side surfaces thereof so that a power cable, a communication line cable, wires to be connected to various sensors of a home security system, and the like are led out therethrough.

On the other hand, the front cover 20 has a plate shape, and is mounted to the upper side of the front side opening portion of the rear case 10 through intermediation of a hinge mechanism 30 so as to be openable and closable upward at an angle larger than 90°.

Note that, the specific structure of the hinge mechanism 30 is omitted from the drawings.

The retaining mechanism 40 is interposed between the rear case 10 and the front cover 20. The front cover 20 is retained in a state of being opened at 90° by the retaining mechanism 40. Further, the retaining mechanism 40 includes a fixed engagement portion 41 and a movable engagement portion 46.

The fixed engagement portion 41 is provided to the upper side of the front side opening portion of the rear case 10. The fixed engagement portion 41 includes a support portion 411 integrally formed with the rear case 10 and a cap portion 412 mounted to the support portion 411 with a screw (not shown).

The support portion 411 includes a rib 411a integrally formed with a bottom surface, a right side surface, and an upper side surface of the rear case 10 having a semi-container shape, and a boss 411b that is formed inside the rib 411a on the back surface of the rear case 10 and is a base portion for screwing so as to mount the cap portion 412. The cap portion 412 has a support surface 412b facing upward.

On the other hand, the movable engagement portion 46 is provided to the front cover 20. The front cover 20 is retained in a state of being opened at 90° in such a manner that the movable engagement portion 46 in a state in which the front cover 20 is opened at 90° disengageably engages with the fixed engagement portion 41.

Further, the movable engagement portion 46 includes two slide holders 461 provided over a back surface and a right side surface of the front cover 20, and a slide bar 462 loosely fitted into through holes of the slide holders 461 at a position corresponding to the fixed engagement portion 41 so as to be slidable in an apparatus height direction H, which is the direction when the front cover 20 is closed.

The slide bar 462 includes a bar main body 462a slidable in the apparatus height direction H, which is the direction when the front cover 20 is closed, and a portion 462b to be supported, which is projected downward in the apparatus height direction H from an end portion of the bar main body 462a, which is located on a depth side in the apparatus depth direction D when the front cover 20 is opened upward at 90°.

The slide bar 462 slides toward the depth side in the apparatus depth direction D due to its weight when the front cover 20 is opened upward at an angle larger than 90°. Subsequently, the portion 462b to be supported is supported by the support surface 412b of the fixed engagement portion 41 when the front cover 20 is closed (returned) at 90°.

In this manner, the front cover 20 is retained in a state of being opened at 90°.

Further, the slide bar 462 includes a hook portion 462c projected further downward in the apparatus height direction H from the depth side of the portion 462b to be supported in the apparatus depth direction D when the front cover 20 is opened upward at 90°. The hook portion 462c engages with the depth side of the support surface 412b in the apparatus depth direction D when the portion 462b to be supported is supported by the support surface 412b of the fixed engagement portion 41. With this, the slide bar 462 is prevented from inadvertently sliding toward a counter-depth side in the apparatus depth direction D to release the retaining of the front cover 20.

Still further, the slide bar 462 further includes a bar retracting knob 462e for operating the slide bar 462 so as to slide toward the counter-depth side in the apparatus depth direction D against its weight when the front cover 20 is opened upward at an angle larger than 90°. Further, the slide bar 462 includes a distal end portion 462d to be brought into abutment against an inner wall surface 463 of the front cover 20 so as not to excessively slide or drop off from the front cover 20 when the front cover 20 is opened upward at an angle larger than 90° and slides toward the depth side in the apparatus depth direction D due to its weight.

Note that, although not illustrated, the portion 462b to be supported and the hook portion 462c of the slide bar 462 or the slide holders 461 are separable. In the separated state, the slide bar 462 is loosely fitted into the slide holders 461, and then the portion 462b to be supported and the hook portion 462c or the slide holders 461 are assembled.

Next, an operation of the wall-mounted housing apparatus according to this embodiment is described referring to FIGS. 3(a) to 3(e) and FIGS. 4(a) to 4(e). Note that, in FIGS. 3(b) to 3(e) and FIGS. 4(a) to 4(d), the screws for mounting the rear case 10 on the wall surface and the circuit board 50 housed in the rear case 10 are omitted from the drawings.

Figure 3:
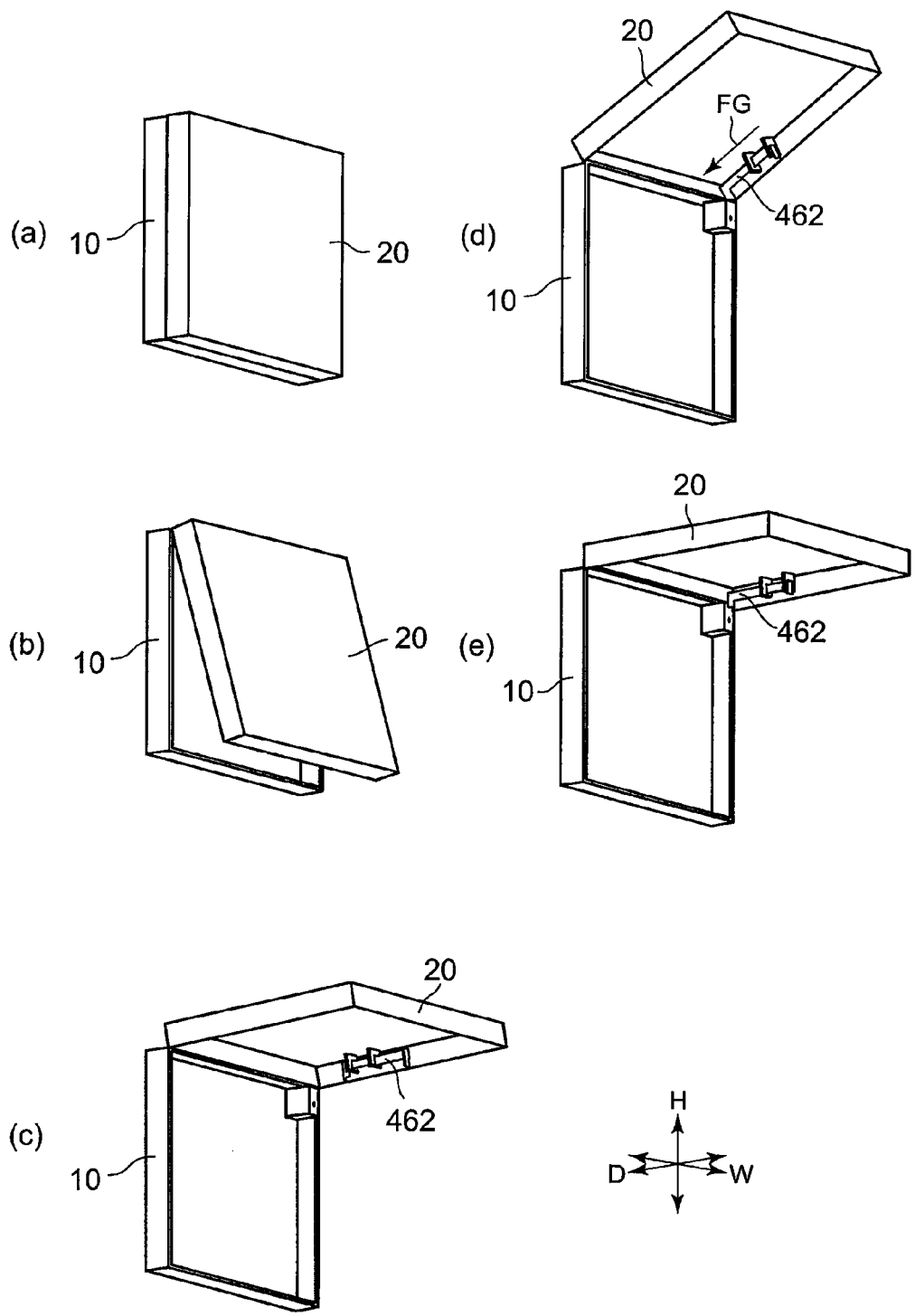
FIG. 3 includes (a) to (e) which are perspective views illustrating an operation for opening a front cover of the wall-mounted housing apparatus according to the embodiment of this invention.

When a service engineer or a user is to perform maintenance or the like of the circuit board 50 (FIG. 1) housed in the wall-mounted housing apparatus of this embodiment, as illustrated in FIGS. 3(b) and 3(c), the service engineer or the user gradually opens the front cover 20 in a state of being closed as illustrated in FIG. 3(a). Further, as illustrated in FIG. 3(d), when the front cover 20 is opened upward at an angle larger than 90°, the slide bar 462 slides toward the depth side in the apparatus depth direction D due to its weight FG. Subsequently, as illustrated in FIG. 3(e), when the front cover 20 is closed (returned) at 90°, the portion 462b to be supported of the slide bar 462 is supported by the support surface 412b of the fixed engagement portion 41 (FIG. 2(b)). With this, the front cover 20 is retained in a state of being opened at 90°, and hence the service engineer or the user can perform the maintenance or the like of the circuit board 50 (FIG. 1) without supporting the front cover 20.

Figure 4:
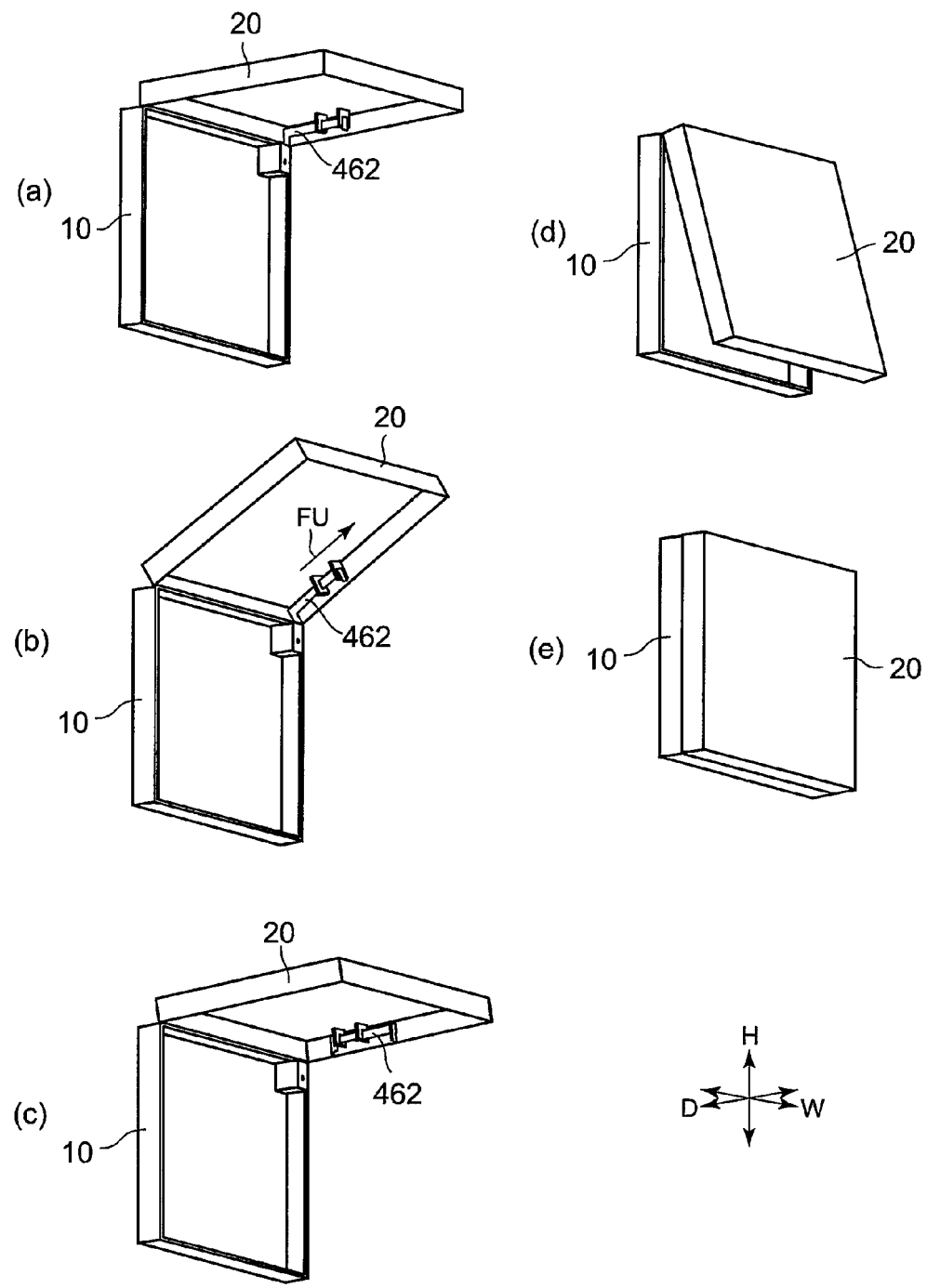
FIG. 4 includes (a) to (e) which are perspective views illustrating an operation for closing the front cover of the wall-mounted housing apparatus according to the embodiment of this invention.

On the other hand, after completing the maintenance or the like of the circuit board 50 (FIG. 1) housed in the wall-mounted housing apparatus of this embodiment, the service engineer or the user opens the front cover 20, which is retained in a state of being opened at 90° as illustrated in FIG. 4(a), upward at an angle larger than 90° as illustrated in FIG. 4(b). At this time, the service engineer or the user causes the slide bar 462 to slide toward the counter-depth side in the apparatus depth direction D by an operation force FU that is greater than the own weight of the slide bar 462. At the time when the front cover 20 is closed (returned) at 90° as illustrated in FIG. 4(c) by causing the slide bar 462 to slide toward the counter-depth side in the apparatus depth direction D, the service engineer or the user releases the slide bar 462. After that, the service engineer or the user gradually closes the front cover 20 as illustrated in FIG. 4(d). Then, the front cover 20 is fully closed as illustrated in FIG. 4(e).

Industrial Applicability

This invention has been described above with reference to the embodiment, but various modifications understandable for a person having ordinary skill in the art may be made to the configurations and details of this invention. This invention encompasses any appropriate combinations of a part or all of the configurations of the embodiment described above.

The invention claimed is:

1. A wall-mounted housing apparatus, which is configured to house a component of an electronic apparatus and is to be installed on a wall surface, the wall-mounted housing apparatus installed on the wall surface having defined therein an apparatus width direction and an apparatus height direction that are parallel to the wall surface, and an apparatus depth direction that is perpendicular to the wall surface, the wall-mounted housing apparatus comprising:
   a rear case having a front side opening portion and having a semi-container shape, the rear case being configured to house the component of the electronic apparatus, the rear case having a back surface that is mounted to the wall surface;
   a front cover having a plate shape, the front cover being mounted to an upper side of the front side opening portion of the rear case through intermediation of a hinge mechanism so as to be openable and closable upward at an angle larger than 90°; and
   a retaining mechanism interposed between the rear case and the front cover, for retaining the front cover in a state of being opened at 90°, the retaining mechanism comprising:
   a fixed engagement portion provided to the upper side of the front side opening portion of the rear case; and
   a movable engagement portion provided to a back surface of the front cover at a position corresponding to the fixed engagement portion, for retaining the front cover in the state of being opened at 90° in such a manner that the movable engagement portion in a state in which the front cover is opened at 90° disengageably engages with the fixed engagement portion, the fixed engagement portion having a support surface facing upward, the movable engagement portion comprising a slide bar slidable in the apparatus height direction, which is the direction when the front cover is closed, the slide bar comprising:
   a bar main body slidable in the apparatus height direction, which is the direction when the front cover is closed; and
   a portion to be supported, which is projected downward in the apparatus height direction from an end portion of the bar main body, which is located on a depth side in the apparatus depth direction when the front cover is opened upward at 90°, the front cover being retained in the state of being opened at 90° in such a manner that, when the front cover is opened upward at the angle larger than 90°, the slide bar slides toward the depth side in the apparatus depth direction due to its weight, and then, when the front cover is closed at 90°, the portion to be supported is supported by the support surface of the fixed engagement portion.

2. A wall-mounted housing apparatus according to claim 1, wherein the slide bar further comprises a hook portion further projected downward in the apparatus height direction from a depth side of the portion to be supported in the apparatus depth direction when the front cover is opened upward at 90°, and wherein the slide bar is prevented from inadvertently sliding toward a counter-depth side in the apparatus depth direction to release retaining of the front cover in such a manner that the hook portion engages with a depth side of the support surface in the apparatus depth direction when the portion to be supported is supported by the support surface of the fixed engagement portion.

3. A wall-mounted housing apparatus according to claim 1, wherein the slide bar further comprises a bar retracting knob for operating the slide bar so as to slide toward the counter-depth side in the apparatus depth direction against a weight of the slide bar when the front cover is opened upward at the angle larger than 90°.

4. A wall-mounted housing apparatus according to claim 1, wherein the rear case and the front cover are made of a resin.

5. A wall-mounted housing apparatus according to claim 1, wherein the fixed engagement portion and the movable engagement portion are made of a resin.

6. An electronic apparatus, comprising:
the wall-mounted housing apparatus according to claim 1; and
the component housed in the wall-mounted housing apparatus.

* * * * *